United States Patent
Tsai et al.

(10) Patent No.: US 8,018,423 B2
(45) Date of Patent: Sep. 13, 2011

(54) SHIFT REGISTER AND LIQUID CRYSTAL DISPLAY

(75) Inventors: Yi-Cheng Tsai, Chiayi County (TW); Chien-Ting Chan, Changhua County (TW); Hsi-Rong Han, Taichung County (TW); Wen-Chun Wang, Taichung (TW); Kuo-Chang Su, Tainan County (TW)

(73) Assignee: Wintek Corporation, Taichung (TW)

( * ) Notice: Subject to any disclaimer, the term of this patent is extended or adjusted under 35 U.S.C. 154(b) by 811 days.

(21) Appl. No.: 12/108,546

(22) Filed: Apr. 24, 2008

(65) Prior Publication Data
US 2008/0266275 A1 Oct. 30, 2008

(30) Foreign Application Priority Data
Apr. 25, 2007 (TW) .............................. 96114697 A

(51) Int. Cl.
*G09G 3/36* (2006.01)
(52) U.S. Cl. ............. 345/100; 345/204; 377/64; 377/69
(58) Field of Classification Search .................. 345/100, 345/204; 377/64, 67, 69, 72, 77
See application file for complete search history.

(56) References Cited

U.S. PATENT DOCUMENTS

| 7,106,292 | B2 * | 9/2006 | Moon .......................... 345/100 |
| 7,289,096 | B2 * | 10/2007 | Jeon et al. ..................... 345/100 |
| 2005/0083292 | A1 * | 4/2005 | Moon et al. .................... 345/100 |
| 2006/0050837 | A1 * | 3/2006 | Jung .............................. 377/67 |
| 2006/0238482 | A1 * | 10/2006 | Jang et al. ..................... 345/100 |
| 2007/0070021 | A1 * | 3/2007 | Ahin et al. .................... 345/100 |

* cited by examiner

*Primary Examiner* — Lun-Yi Lao
*Assistant Examiner* — Kelly B Hegarty
(74) *Attorney, Agent, or Firm* — Thomas|Kayden

(57) ABSTRACT

A shift register is for generating scan signals. Each stage of the shift register comprises a first level lifting unit and at least a second level lifting unit, a first level lowering unit and at least a second level lowering unit, first and second driving units. The first level lowering and lifting units are for controlling the levels of signals at the first output terminal to output a first scan signal. The second level lowering unit and second level lifting unit are for controlling the levels of signals at the second output terminal to output at least a second scan signal. The first and second driving units are for turning on and off the first and the second level lifting units and the first and the second level lowering unit to control the first and second scan signals.

35 Claims, 12 Drawing Sheets large font at top center: US 8,018,423 B2

SHIFT REGISTER AND LIQUID CRYSTAL DISPLAY

This application claims the benefit of Taiwan application Serial No. 96114697, filed Apr. 25, 2007, the subject matter of which is incorporated herein by reference.

BACKGROUND OF THE INVENTION

1. Field of the Invention

The invention relates in general to a shift register, and more particularly to a shift register whose shift register unit can output two output signals.

2. Description of the Related Art

Along with technology development, nowadays, a liquid crystal display (LCD) has been widely applied in electronic products, such as TV, computer monitors, notebook computers, mobile phones or personal digital assistants. The LCD includes a data driver, a scan driver and a liquid crystal display panel. The display panel has a pixel matrix, and the scan driver is for sequentially enabling the pixel rows of the pixel matrix to transmit the pixel data outputted by the data driver to the corresponding pixels so as to display the required images.

The present technique implements the scan driver sequentially enabling the corresponding pixel rows of the pixel matrix mainly by using a shift register. Therefore, how to design a shift register with a simplified circuit structure and lower power consumption and reduce power consumption of the LCD module is constantly an essential target of the relevant industrials' efforts.

SUMMARY OF THE INVENTION

The invention is directed to a shift register and liquid crystal display (LCD) using the same. The shift register can effectively improve the drawback of the conventional shift register with complicated circuits and higher power consumption and substantially have the advantages of having a simply circuit structure and lower power consumption. Besides, the LCD using the same has the advantage of lower power consumption.

According to a first aspect of the present invention, a shift register is provided. The shift register is applied to a scan driver of a LCD for generating a number of scan signals. The shift register comprises a number of stages of shift register units. Each of the shift register units comprises a first level lifting unit and at least a second level lifting unit, a first level lowering unit and at least a second level lowering unit, a first driving unit and a second driving unit. The first level lifting unit and at least a second level lifting unit are for respectively providing a first timing signal to a first output terminal and at least a second timing signal to at least a second output terminal. The first level lowering unit and at least a second level lowering unit are for respectively providing a first voltage to the first output terminal and at least a second output terminal. The first driving unit is coupled to input terminals of the first level lifting unit and the second level lifting unit at a first node. The voltage of the first node is a first control signal. The first driving unit is for turning on the first level lifting unit and the second level lifting unit in response to a front edge of an input signal and turning off the first level lifting unit and the second level lifting unit as a level of a second control signal is higher than a level of a third control signal. The second driving unit is coupled to input terminals of the first level lowering unit and the second level lowering unit at a second node. The second driving unit is for turning off the first level lowering unit and the second level lowering unit in response to a front edge of the first control signal and turning on the first level lowering unit and the second level lowering unit in response to a rear edge of the first control signal. The first output terminal and the second output terminal are for respectively outputting a first scan signal and at least a second scan signal. The input signal is the second scan signal of the previous-stage shift register unit.

According to a second aspect of the present invention, a LCD is provided. The LCD comprises a display panel, a data driver, and a scan driver. The display panel has a pixel matrix. The data driver is for providing a plurality of pieces of pixel data. The scan driver comprises a first shift register for providing a plurality of scan signals for enabling pixels of the pixel matrix to display a data frame according to the pixel data. The first shift register comprises a plurality of stages of shift register units and each of the shift register units comprises a first level lifting unit and at least a second level lifting unit, a first level lowering unit and at least a second level lowering unit, a first driving unit and a second driving unit. The first level lifting unit and at least a second level lifting unit are for respectively providing a first timing signal to a first output terminal and at least a second timing signal to at least a second output terminal. The first level lowering unit and at least a second level lowering unit are for respectively providing a first voltage to the first output terminal and at least a second output terminal. The first driving unit is coupled to input terminals of the first level lifting unit and the second level lifting unit at a first node. The voltage of the first node is a first control signal. The first driving unit is for turning on the first level lifting unit and the second level lifting unit in response to a front edge of an input signal and turning off the first level lifting unit and the second level lifting unit as a level of a second control signal is higher than a level of a third control signal. The second driving unit is coupled to input terminals of the first level lowering unit and the second level lowering unit at a second node. The second driving unit is for turning off the first level lowering unit and the second level lowering unit in response to a front edge of the first control signal and turning on the first level lowering unit and the second level lowering unit in response to a rear edge of the first control signal. The first output terminal and the second output terminal are for respectively outputting a first scan signal and at least a second scan signal. The input signal is the second scan signal of the previous-stage shift register unit.

The invention will become apparent from the following detailed description of the preferred but non-limiting embodiments. The following description is made with reference to the accompanying drawings.

DETAILED DESCRIPTION OF THE INVENTION

Each stage of shift register unit in the shift register of the embodiment of the invention has at least two sets of output-signal control units for providing at least two output signals at a time.

Embodiment One

Figure 1:
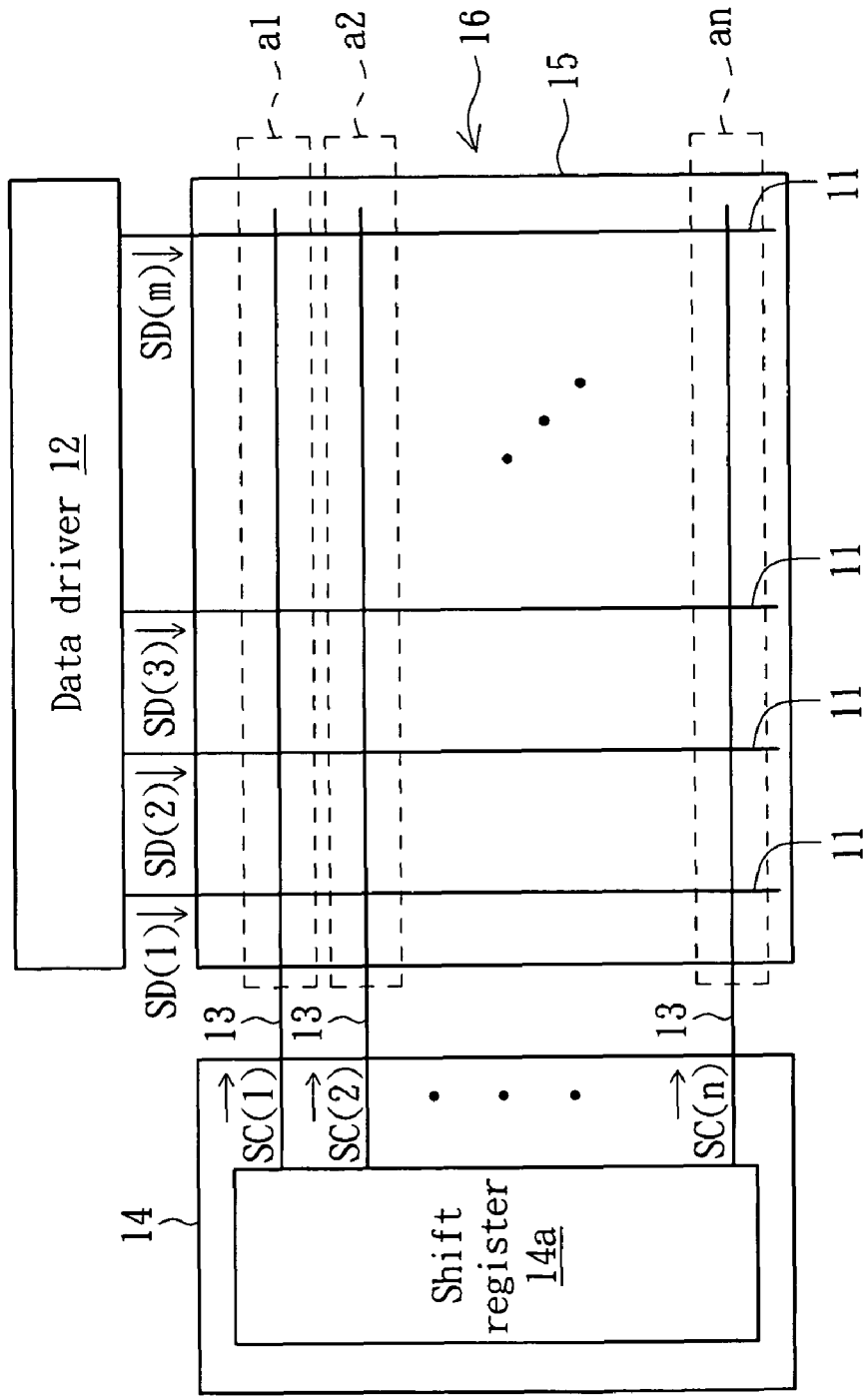
FIG. 1 is a block diagram of a LCD according to a first embodiment of the invention.

Referring to FIG. 1, a block diagram of a LCD according to a first embodiment of the invention is shown. A LCD 10 includes a data drive 12, a scan driver 14 and a display panel 16. The data driver 12 is for providing data signals SD(1)~SD(m) to the display panel 16 via m data lines 11, and the scan driver 14 is for providing scan signal SC(1)~SC(n) to the display panel 16 via n scan lines 13. The display panel 16 includes an n×m pixel matrix 15, wherein the n pixel rows a1~an are respectively enabled by the scan signals SC(1)~SC(n) to display a display frame according to the corresponding data signals SD(1)~SD(m), and n, m are natural numbers.

In the embodiment, the scan driver 14 has a shift register 14a with a number of stages of shift register units for instance. The shift register units are for respectively providing the n scan signals SC(1)~SC(n). The shift register 14a will be illustrated in details in the following description.

Figure 2:
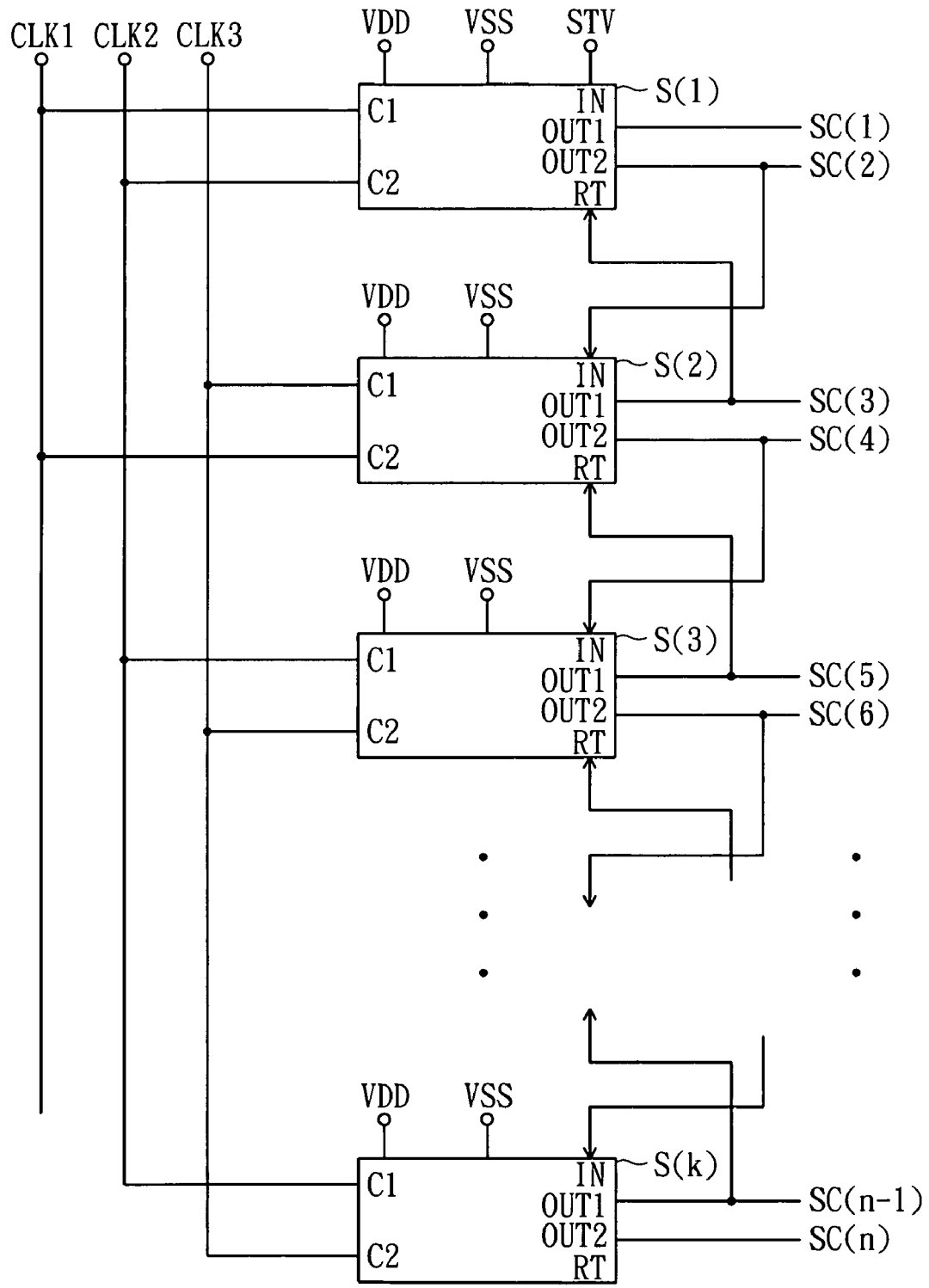
FIG. 2 is a detailed block diagram of the shift register in FIG. 1.

Referring to FIG. 2, a detailed block diagram of the shift register 14a in FIG. 1 is shown. The shift register 14a includes k shift register units S(1)~S(k) coupled to each other in series. The shift register units S(1)~S(k) have the same structure for instance. In the embodiment, each of the shift register units S(1)~S(k) includes an input terminal IN, at least two output terminals OUT1, OUT2, a control terminal RT, and timing terminals C1 and C2 for generating at least two scan signals at the at least two output terminals OUT1 and OUT2, wherein k is a natural number larger than 1, and is an even number in the embodiment.

The input terminal IN of the shift register S(1) receives a start signal STV and the input terminals IN of the shift registers S(2)~S(k) respectively receive the scan signals SC(2), SC(4), . . . , SC(n−2) outputted by the output terminals OUT2 of their previous-stage shift register units. The shift register units S(j) and S(j+2) in the shift register units S(1)~S(k) substantially receive the same timing signal. That is, the timing signals received by the shift register units S(1)~S(k) are repeated every three stages, wherein j is a natural number. For example, the shift register units S(1), S(2) and S(3) respectively receive timing signals CLK1 and CLK2, timing signals CLK3 and CLK1, and timing signals CLK2 and CLK3. The shift register units S(4)~S(6) respectively receive the same timing signals as the shift register units S(1)~S(3). The enabling time of the timing signals CLK1, CLK2 and CLK3 is not overlapped.

The control terminals RT of the shift register units S(1)~S(k−1) respectively receive the scan signals SC(3)~SC(n−1) outputted by the next-stage shift register units S(2)~S(k). In the following description, the shift register S(1) is exemplified to illustrate each stage of shift register unit S(1)~S(k) in the shift register 14a.

Figure 3:
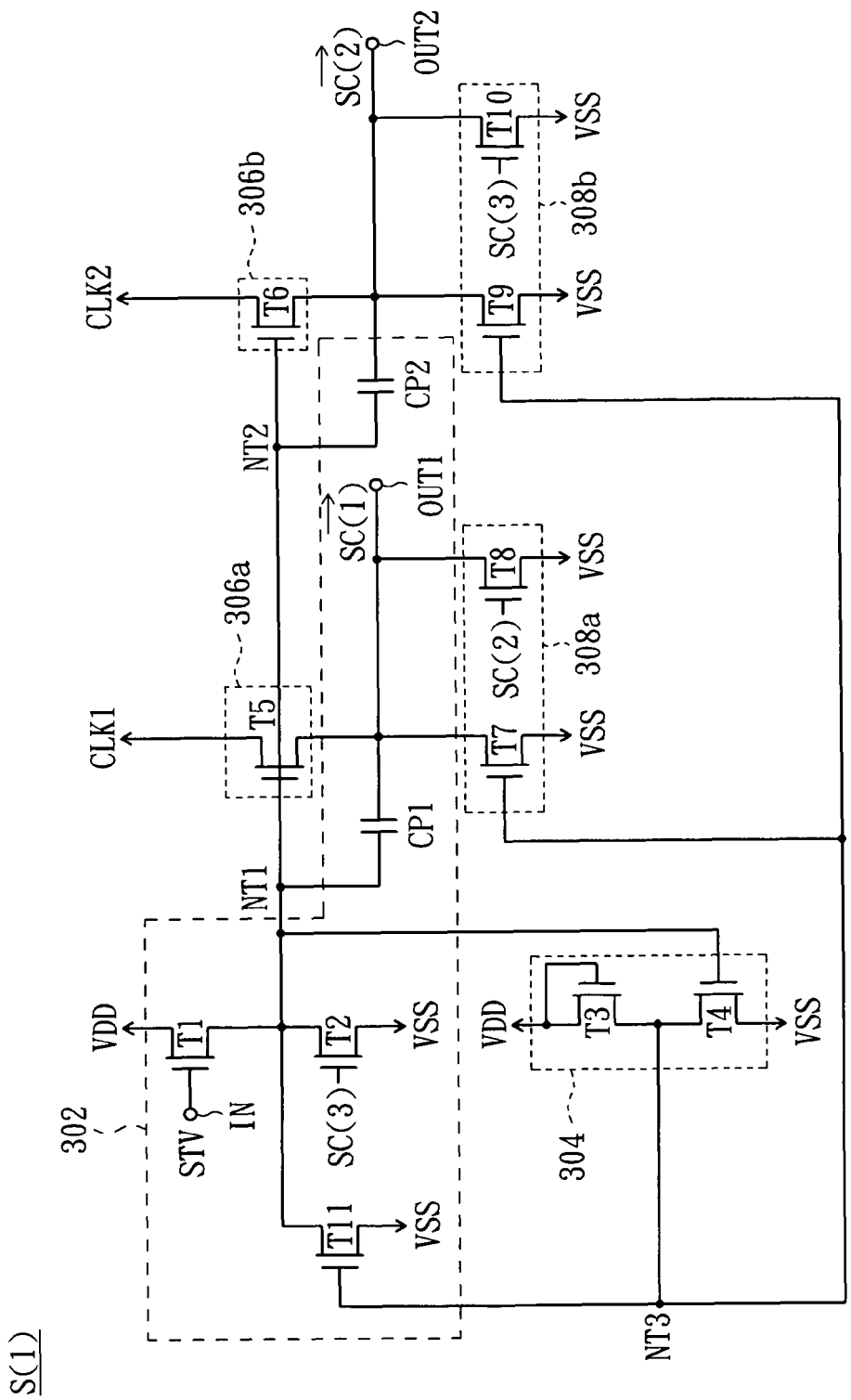
FIG. 3 is a detailed circuit diagram of the shift register unit S(1) in FIG. 2.

Referring to FIG. 3, a detailed circuit diagram of the shift register unit S(1) in FIG. 2 is shown. The shift register unit S(1) of the embodiment includes driving units 302 and 304, first level lifting unit 306a and at least a second level lifting unit 306b, first level lowering unit 308a and at least a second level lowering unit 308b.

For example, the driving unit 302 includes transistors T1, T2 and T11, and the driving unit 304 includes transistors T3 and T4. The first level lifting unit 306a includes a transistor T5 and the second level lifting unit 306b includes a transistor T6. The first level lowering unit 308a includes transistors T7 and T8, and the second level lowering unit 308b includes transistors T9 and T10. In the embodiment, the transistors T1~T11 are all exemplified to be N-type thin film transistors (TFTs) for illustration.

The transistors T5 and T6 have gates coupled to a node NT1 (NT2) (the nodes NT1 and NT2 can be considered to be the same node), drains for respectively receiving the timing signals CLK1 and CLK2, and sources respectively coupled to the output terminals OUT1 and OUT2. The transistors T5 and T6 are respectively for providing the timing signals CLK1 and CLK2 to the output terminals OUT1 and OUT2. The voltage at the node NT1 (NT2) is equal to a control signal Vc1(1).

The transistors T7 and T8 have gates respectively coupled to a node NT3 and receiving the scan signal SC(2) outputted by the output terminal OUT2, drains commonly coupled to the output terminal OUT1 and drains for receiving a voltage VSS. The transistors T9 and T10 have gates respectively coupled to the node NT3 and receiving the scan signal SC(3) of the shift register unit S(2), drains commonly coupled to the output terminal OUT2 and sources for receiving the voltage VSS. The output terminals OUT1 and OUT2 are respectively for outputting the scan signals SC(1) and SC(2) and the voltage VSS is a lowest voltage level of the shift register 14a for instance. The voltage at the node NT3 is equal to a control signal Vc2(n). The transistors T7 and T9 are for providing the voltage VSS to the output terminals OUT1 and OUT2 in response to a rising edge of the control signal Vc2(n).

The source of the transistor T1 and the drain of the transistor T2 are both coupled to the node NT1 (NT2), while the drain of the transistor T1 and the source of the transistor T2 are respectively for receiving the voltages VDD and VSS. The gates of the transistors T1 and T2 respectively receive the start signal STV and the scan signal SC(2). The transistor T1 is for turning on the transistors T5 and T6 in response to a front edge of the start signal STV, and the transistor T2 is for turning off the transistors T5 and T6 as the level of the scan signal SC(3) is higher than the voltage VSS. For example, the voltage VDD is a highest voltage level of the shift register 14a, and the front edge of the start signal STV is a rising edge. The transistor T11 has a drain coupled to the node NT1 (NT2) for receiving the control signal Vc1(1), a gate coupled to the node NT3 for receiving the control signal Vc2(1) and a source for receiving the voltage VSS. The transistor T11 is for providing the voltage VSS to the node NT1 (NT2) to control the control signal Vc1(n) to be equal to the voltage VSS in response to the rising edge of the control signal Vc2(n).

The source of the transistor T3 and the drain of the transistor T4 are both coupled to the node NT3, and the source of the transistor T3 and the drain of the transistor T4 respectively receive the voltages VDD and VSS. The gates of the transistors T3 and T4 respectively receive the voltage VDD and control signal Vc1(1), which is the voltage at the node NT1

(NT2). The width/length (W/L) ratio of the transistor T4 is larger than that of the transistor T3. For example, the driving unit 304 is a bias unit for lowering down a level of the control signal Vc2(1), which is the voltage at the node NT3, in response to the front edge of the control signal Vc1(1) so as to turn off the transistors T7 and T9, and lifting up the level of the control signal Vc2(1) at the node NT3 in response to the rear edge of the control signal Vc1(1) so as to turn on the transistors T7 and T9. The front edge and the rear edge of the control signal Vc1(1) are respectively a rising edge and a falling edge for instance.

Figure 4:
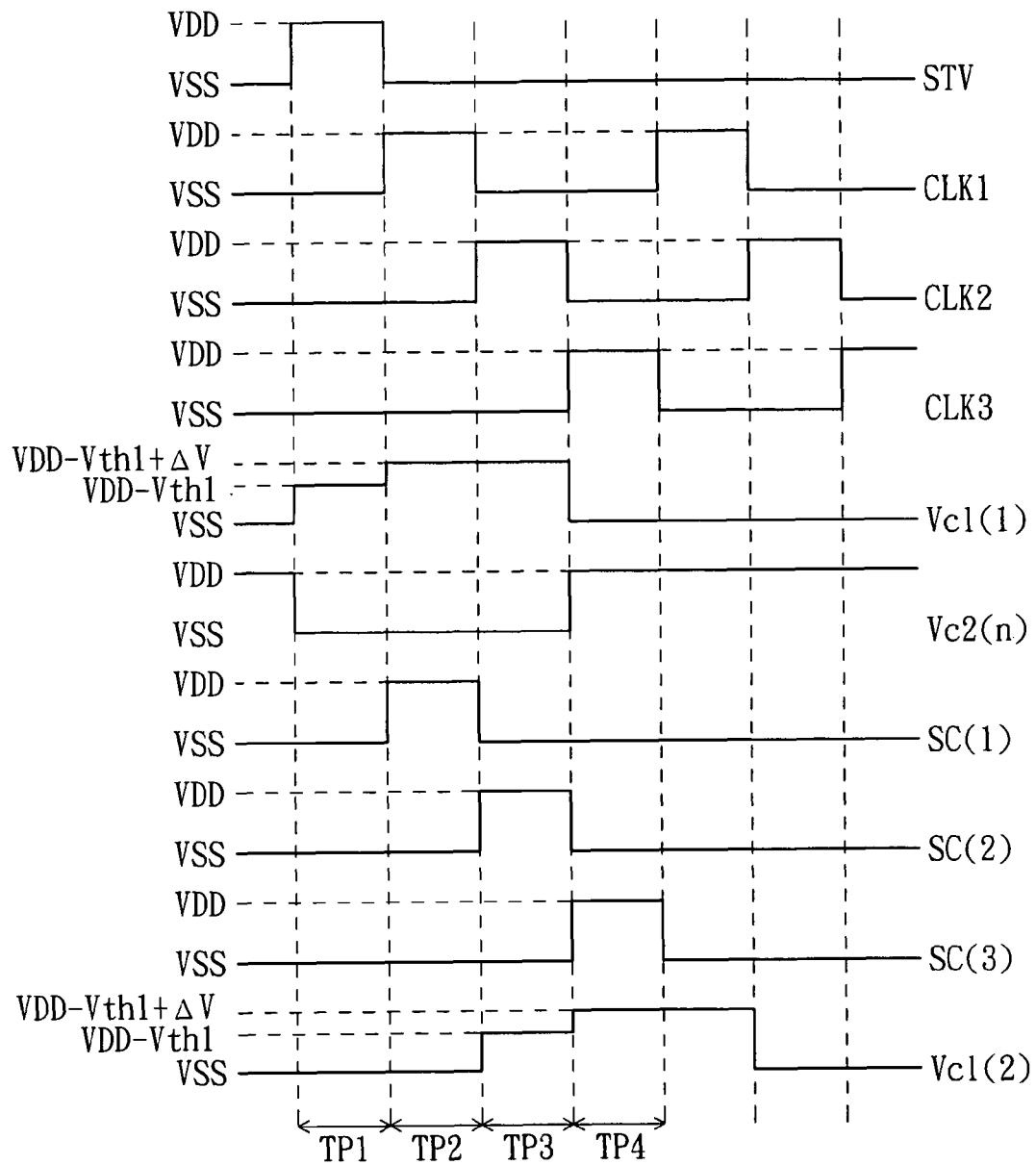
FIG. 4 is a relevant timing diagram of the shift register unit S(1) in FIG. 3.

Referring to FIG. 4, a relevant timing diagram of the shift register unit S(1) in FIG. 3 is shown. In the time period TP1, the start signal STV is equal to the voltage VDD, and the timing signal CLK1, CLK2 and scan signal SC(3) are all equal to the voltage VSS. At the time, the transistor T2 is turned off, and the transistor T1 is turned on to further turn on the transistors T5 and T6 such that the scan signals SC(1) and SC(2) are respectively equal to the timing signals CLK1 and CLK2, that is the voltage VSS. As a result, the transistors T8 and T10 are turned off. The transistor T1 controls the control signal Vc1(1) to be equal to Vc1(n)=VDD−Vth1, wherein Vth1 is the threshold voltage of the transistor T1. The transistor T4 is also turned on such that the control signal Vc2(1) is close to the voltage VSS and the transistors T7 and T9 are turned off.

In the time period TP2, the start signal STV and the scan signal SC(3) are equal to the voltage VSS, and the timing signal CLK1 is equal to the voltage VDD. At the time, the transistors T1 and T2 are both turned off such that the node NT1 (NT2) is floating. The timing signal CLK1 is increased from the voltage VSS to VDD in the time period TP2. This large voltage variation will increase the voltage signal Vc1(1) by a difference voltage ΔV due to a boot-strapping effect. As a result, the voltage signal Vc1(1) is equal to (VDD−Vth1+ΔV). In the embodiment, the difference voltage ΔV is equal to $$\Delta V = \frac{C_{gs}}{C_{p1} + C_{gs}}(VE - VDE),$$

wherein Cgs is an inner parasitic capacitor (not shown in the figure), Cp1 is an equivalent capacitor as seen from the node NT1 (NT2). At the time, the transistor T5 is turned on to provide the timing signal CLK1, that is, the voltage VDD, to the output terminal OUT1 such that the scan signal SC(1) is equal to the voltage VDD. The transistor T6 is also turned on to continuously provide the timing signal CLK2, that is, the voltage VSS, to the output terminal OUT2 such that the scan signal SC(2) is equal to the voltage VSS. The transistor T4 is also turned on such that the control signal Vc2(n) is close to the low voltage VSS. As a result, the transistors T7 and T9 are turned off and the transistors T8 and T10 are also turned off.

In the time period TP3, the timing signal CLK2 is increased from the voltage VSS to VDD. At the time, the transistor T6 provides the timing signal CLK2, that is, the voltage VDD to the output terminal OUT2 such that the scan signal SC(2) is equal to the voltage VDD. The control signal Vc1(1) maintains to be (VDD−Vth1+ΔV) such that the control signal Vc2(n) is continuously equal to the voltage VSS. The transistors T7, T9 and T10 are all turned off. The transistor T8 is turned on to lower down the level of the scan signal SC(1) to the voltage VSS.

In the time period TP4, the scan signal SC(3) is equal to the voltage VDD. At the time, the transistor T2 is turned on to lower down the voltage Vc1(1) to the voltage VSS. The transistor T10 is also turned on to lower down the scan signal SC(2) to the voltage VSS. The transistor T4 is turned off such that the bias unit biases the control signal Vc2(1) to be the voltage VDD. As a result, the transistors T7 and T9 are turned on to lower down the scan signal SC(1) and SC(2).

From the above description, the shift register unit S(1) of the embodiment generates a high-level control signal Vc1(1) to turn on the transistors T5 and T6 in the time periods TP1~TP3 so as to respectively provide the timing signals CLK1 and CLK2 as the scan signals SC(1) and SC(2). In the time periods TP3 and TP4, the scan signals SC(2) and SC(3) are respectively used to turn on the transistors T8 and T10 to provide the voltage VSS to be the scan signals SC(1) and SC(2). Therefore, the shift register unit S(1) of the embodiment can effectively generate scan signals SC(1) and SC(2) according to the timing signals CLK1~CLK3 by using the corresponding circuit structure.

The control signal Vc2(1) of the embodiment is maintained equal to the voltage VDD in the time periods except for TP1~TP3 to turn on the transistors T7 and T9 so as to control the scan signals SC(1) and SC(2) to be equal to the voltage VSS and prevent that the scan signals SC(1) and SC(2) are interfered by noise to result in an error scan operation of the LCD 10. However, the transistors T7 and T9, as turned on for a long time, will have higher threshold voltages due to a stress effect, which leads to a malfunction. The transistors T8 and T10 of the embodiment can lower down the scan signals SC(1) and SC(2) to the voltage VSS as the transistors T7 and T9 have malfunction to prevent the scan signals SC(1) and SC(2) from getting wrong levels.

In the embodiment, although only the shift register unit S(1) of the shift register 14a is exemplified for illustration, operations of the other shift register units S(2)~S(k) can also be performed analogically according to the operational principle of the shift register unit S(1). In the embodiment, although the shift register unit S(1) is exemplified to include a second level lifting unit 306b and a second level lowering unit 308b for illustration, the shift register S(1) of the embodiment can further include two or more than two second level lifting units 306b and second level lowering unit 308b so as to output three or more than three scan signals.

Although the shift register unit S(1) is exemplified to have a circuit structure including 11 transistors T1~T11 in the embodiment, the circuit structures of the driving units 302 and 304, the first and the second level lifting units 306a and 306b, and the first and the second level lowering units 308a and 308b of the shift register S(1) are not limited to the structure of the shift register unit S(1) of the embodiment, and any alternative is not apart from the scope of the invention.

Figure 5:
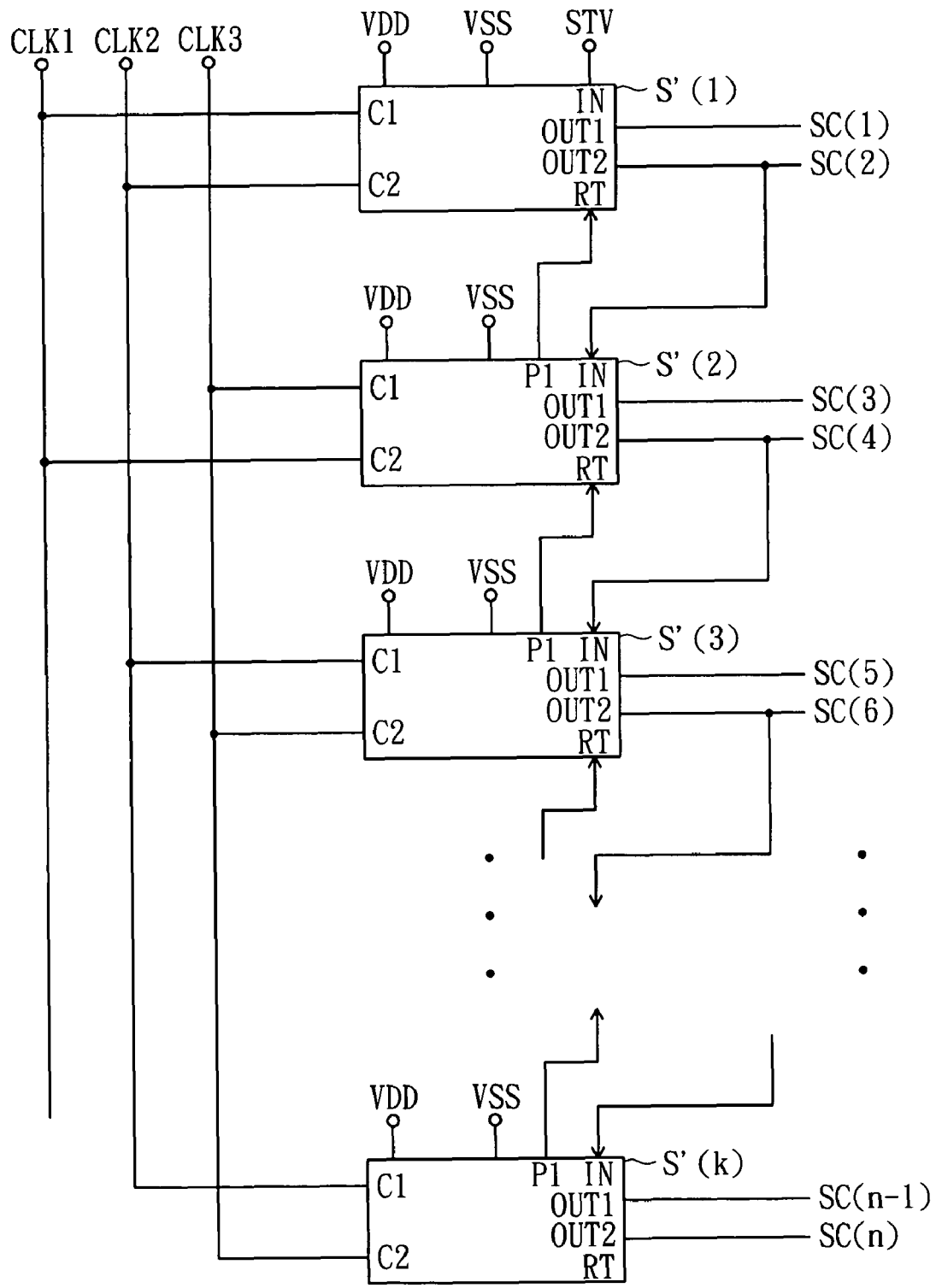
FIG. 5 is another detailed block diagram of the shift register in FIG. 1.
Figure 6:
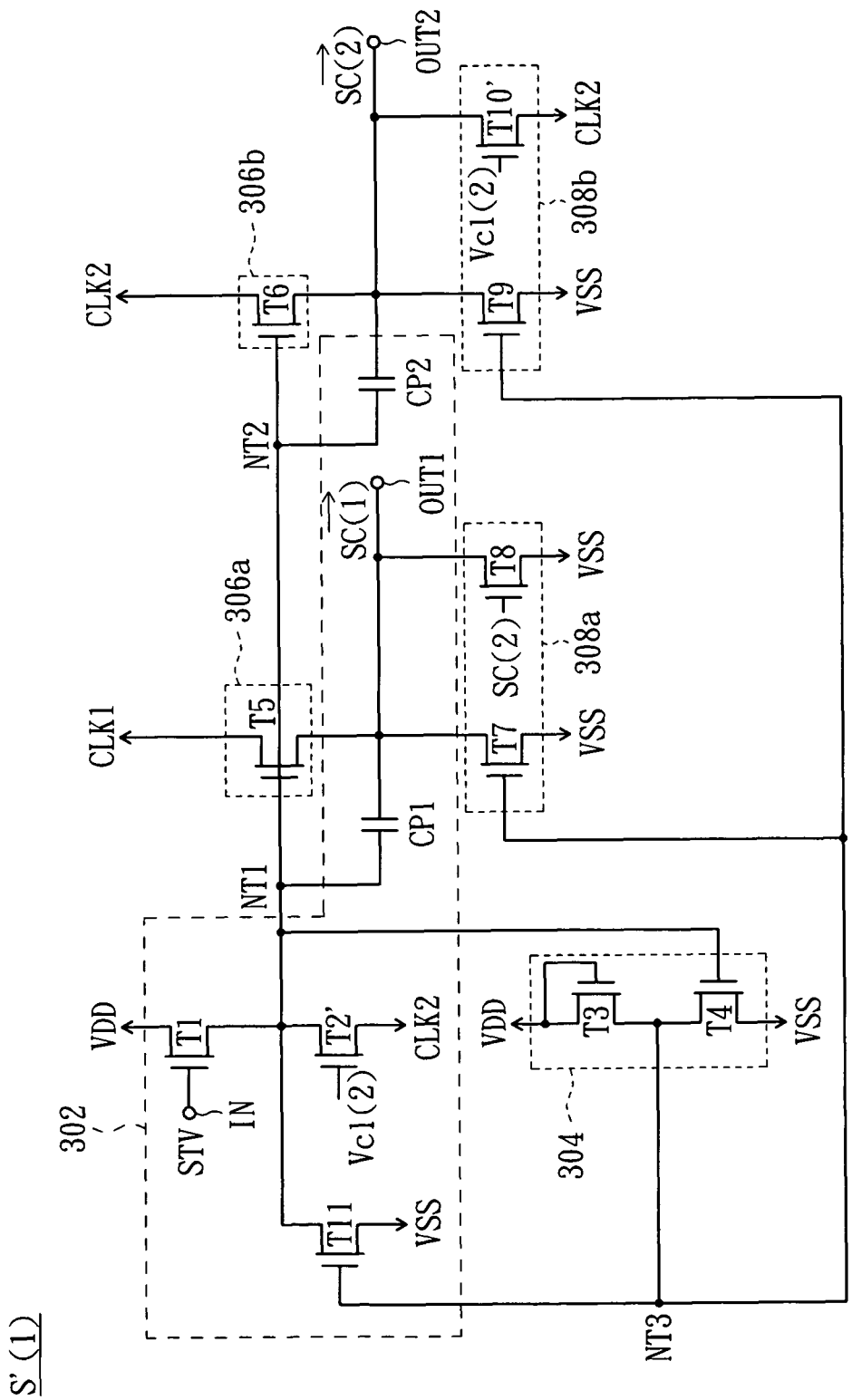
FIG. 6 is a detailed circuit diagram of the shift register unit S'(1) in FIG. 5.

For example, the circuit structures of the shift register 14a and the shift register unit S(1) can be respectively designed as shown in FIGS. 5 and 6, which are respectively another block diagram of the shift register 14a of FIG. 1 and another detailed circuit diagram of the shift register S(1). The difference between the shift register 14a' in FIG. 5 and the shift register 14a in FIG. 2 lies on that the control terminals RT of the shift register units of the shift register 14a' respectively receive control signals Vc1(2)~Vc2(k) of the next-stage shift registers units S'(2)~S'(k). The difference between the shifter register unit S'(1) in FIG. 6 and the shift register unit S(1) of FIG. 3 lies on that the transistors T2' and T10' of the shift register unit S' (1) have gates for receiving the control signal Vc1(2) that is outputted from the next-stage shift register unit S'(2) and sources for receiving the timing signal CLK2. In other words, the shift register unit S'(1) receives the control signal Vc1(2) that is outputted from the node NT1 (NT2), which is denoted as terminal P1 in FIG. 5, of the next-stage shift register unit S'(2).

The control signal Vc1(2) has a level increased from Vc1(2)=VDD−Vth1 to Vc1(2)=VDD−Vth1+ΔV in the time period TP4, while the timing signal CLK2 is respectively equal to the voltages VDD and VSS in the time periods TP3 and TP4. Therefore, the transistors T2' and T10' can also be turned on in the time period TP4 to lower down the control signal Vc1(1) and the scan signal SC(2) to the voltage VSS. As a result, the shift register units S'(1) and S(1) can substantially have the same operation. The other stages of shift register units S'(2)~S'(k) have substantially the same operations as the corresponding shift register units S(2)~S(k).

The shift register unit of the embodiment can generate two or more than two scan signals in response to two of three timing signals through a suitable circuit design. Therefore, the shift register of the embodiment can effectively generate the same number of scan signals by using substantially a half of shift register units. Consequently, the shift register of the embodiment can have fewer shift register units, more simplified circuit structure and lower power consumption.

Besides, in the embodiment, in some situations, the output signals of the shift register unit are not used to control the circuit operations of the present stage of shift register unit or other stages of shift register units. Therefore, the shift register unit in the situations further has slighter distortion of output signals and the LCD using the same can have display frames of better quality.

Furthermore, more than two transistors are disposed in the level lowering unit of the shift register unit of the embodiment. Therefore, when one of the transistors has malfunction due to the stress effect, the shift register unit of the embodiment can still lower down the scan signal to have the lowest voltage level by another transistor. As a result, the n-th stage of shift register unit of the embodiment can have longer lifetime.

Embodiment Two

Figure 7:
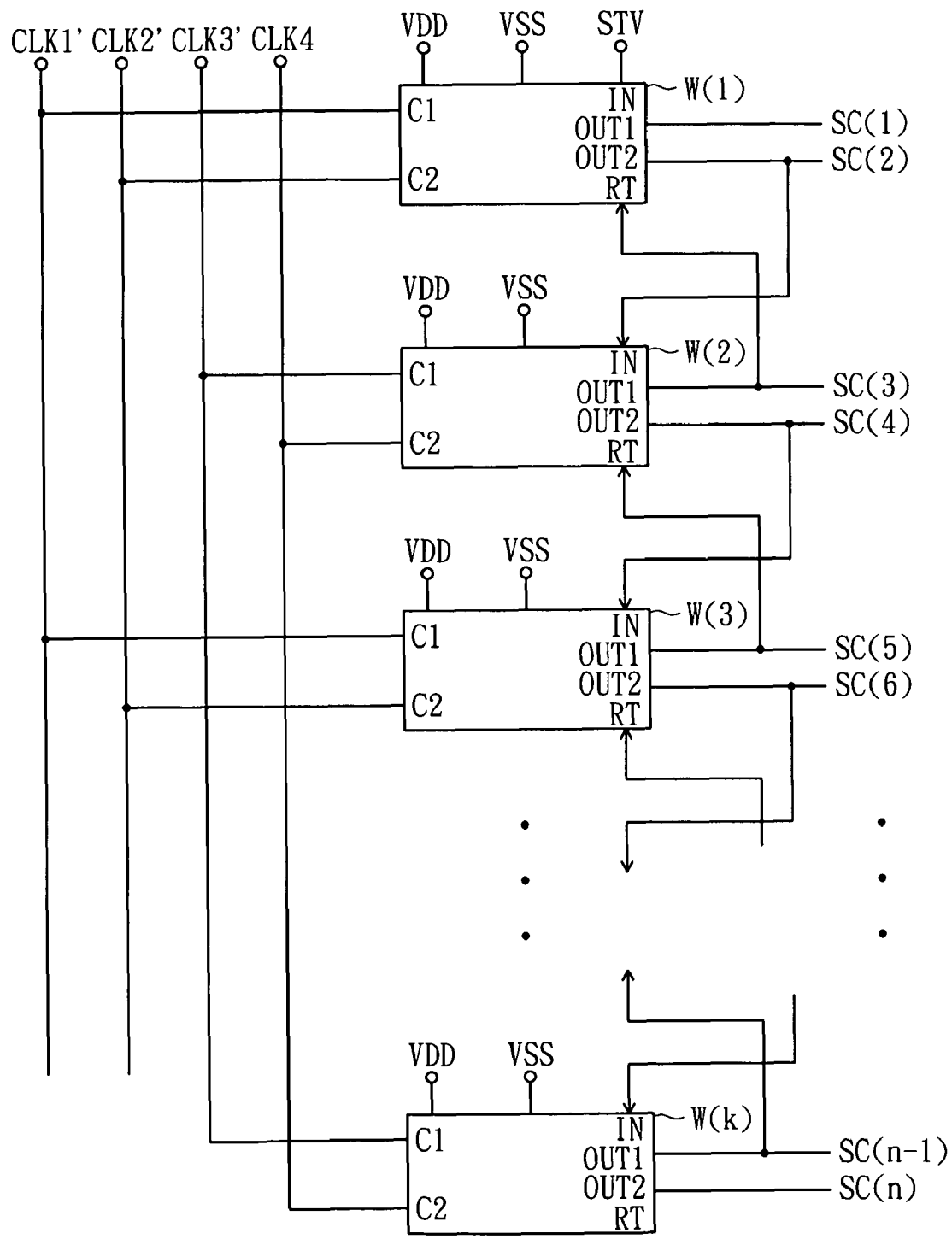
FIG. 7 is a block diagram of the shift register according to a second embodiment of the invention.

Referring to FIG. 7, a block diagram of the shift register according to a second embodiment of the invention is shown. The shift register 40 of the embodiment differs from the shift register 14a of the first embodiment by using four timing signals CLK1', CLK2', CLK3' and CLK4'. The odd-stage shift register units W(1), W(3), . . . , W(k−1) of the shift registers W(1)~W(k) in the shift register 40 receive the timing signals CLK1' and CLK2' while the even-stage shift register units W(2), W(4), . . . , W(k) receive the timing signals CLK3' and CLK4'.

Figure 8:
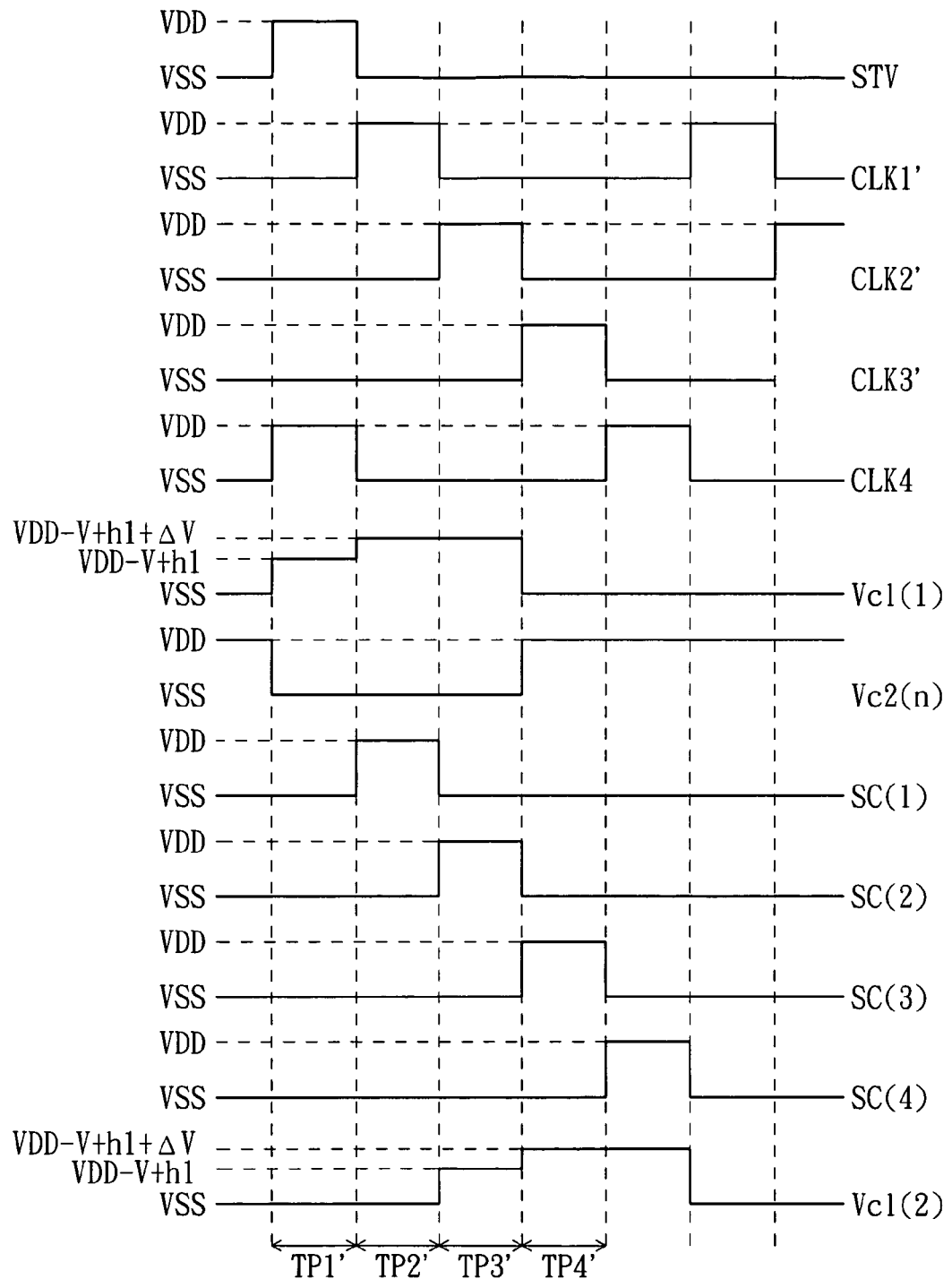
FIG. 8 is a relevant timing diagram of the shift register unit W(1) in FIG. 7 according to the second embodiment of the invention.

A timing diagram about the signal waveforms of the timing signals CLK1', CLK2', CLK3' and CLK4' and the relevant signals of the first-stage shift register unit W(1) are shown in FIG. 8. The control signals Vc1(1) and Vc2(1) of the embodiment have substantially the same waveforms as the corresponding signals in the first embodiment for generating the scan signals SC(1) and SC(2) in response to the timing signals CLK1' and CLK2'. Therefore, the first-stage shift register unit W(1) of the shift register 40 of the embodiment can respectively generate high-level scan signals SC(1) and SC(2) in response to the first rising edges of the timing signals CLK1' and CLK2' after the rising edge of the start signal STV. The even-stage shift register units W(2), W(4), . . . , W(k) can respectively generate high-level scan signals SC(3) and SC(4), SC(7) and SC(8), . . . , SC(n−1) and SC(n) in response to the first rising edges of the timing signals CLK3' and CLK4' after the rising edges of the scan signals SC(2), SC(4), . . . , SC(n−2) outputted by the output terminals OUT2 of the previous-stage shift register units W(1), W(3), . . . , W(k−1).

According to the similar principle, the odd-stage shift register units W(3), W(5), . . . , W(k−1) can also respectively generate high-level scan signals SC(5) and SC(6), SC(9) and SC(10), . . . , SC(n−3) and SC(n−2) in response to the first rising edges of the timing signals CLK1' and CLK2' after the rising edges of the scan signals SC(4), SC(8), . . . , SC(n−4) outputted by the output terminals OUT2 of the previous-stage shift register units W(1), W(3), . . . , W(k−1). As a result, the shift register 40 of the embodiment can also effectively generate two scan signals SC(1) and SC(2), . . . , SC(n−1) and SC(n) respectively through the shift register units W(1)~W(k).

The shift register units W(1)~W(k) of the shift register 40 of the embodiment can also have alternative circuit structures shown in FIGS. 3 and 6, which result in the operations similar to the above. From the above, the shift register of the embodiment also have the advantages of using fewer shift register units, and having more simplified circuit structure, lower power consumption, slighter signal distortion and longer lifetime.

Embodiment Three

Figure 9:
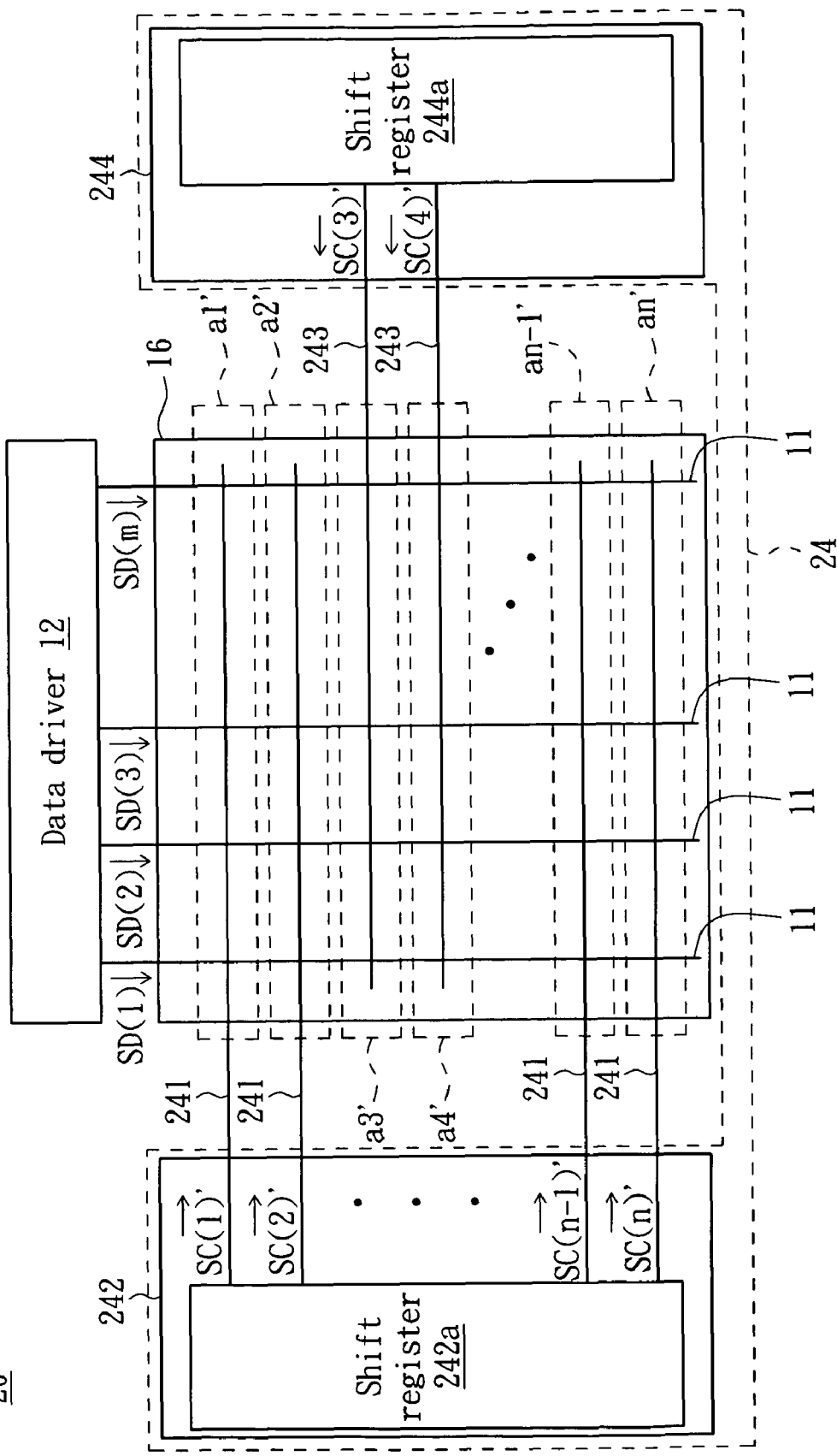
FIG. 9 is a block diagram of a LCD according to a third embodiment of the invention.

Referring to FIG. 9, a block diagram of a LCD according to a third embodiment of the invention is shown. The difference between the LCD 20 of the embodiment and the LCD 10 of FIG. 1 lies on that the LCD 20 uses a double-sided scan driver 24 for providing scan signals SC(1)'~SC(n)' to scan pixel rows a1'~an' of a liquid crystal display panel 16. The scan driver 24 includes a first scan driver 242 and a second scan driver 244, respectively disposed at two sides of the liquid crystal display panel 16. In the embodiment, the first scan driver 242 is exemplified to further include a shift register 242a for providing scan signals SC(1)', SC(2)', SC(5)', SC(6)', . . . , SC(n−1)' and SC(n)' to the liquid crystal display panel 16 via scan lines 241. The second scan driver 244 is exemplified to further include a shift register 244a for providing scan signals SC(3)', SC(4)', SC(7)', SC(8)', . . . , SC(n−3)' and SC(n−2)' to the liquid crystal display panel 16 via scan lines 243.

Figure 10:
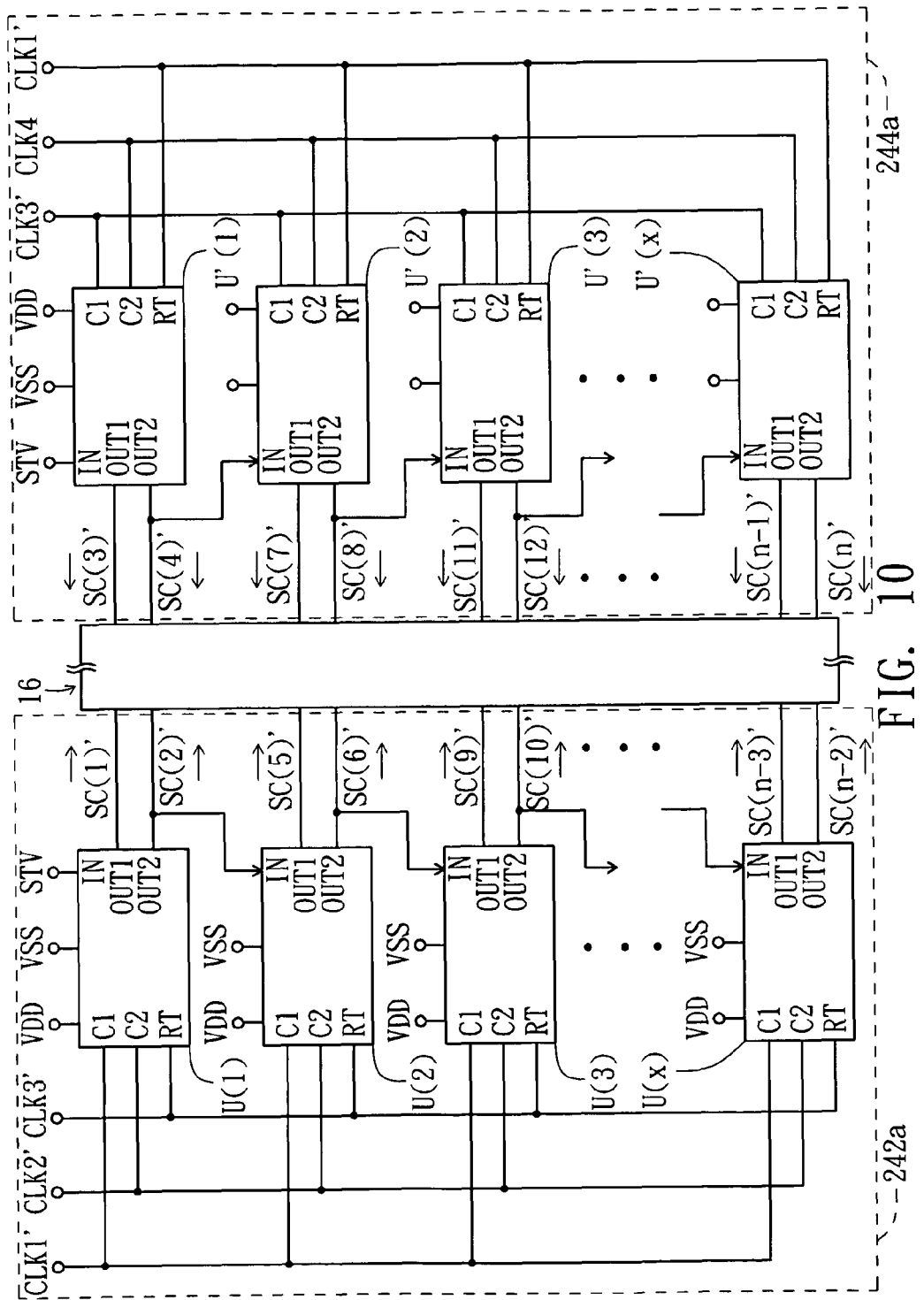
FIG. 10 is a detailed block diagram of the shift registers and in FIG. 9.

Referring to FIG. 10, a detailed block diagram of the shift registers 242a and 244a in FIG. 9 is shown. The difference between the shift register 242a and the shift register 40 in FIG. 7 lies on that shift register units U(1)~U(x) of the shift register 242a have the timing terminals C1 and C2 and the control terminals RT for respectively receiving the timing signals CLK1', CLK2' and CLK3', and the output terminals OUT1 and OUT2 for respectively outputting the scan signals SC(1)' and SC(2)', SC(5)' and SC(6)', . . . , SC(n−3)' and SC(n−2)', wherein x is a natural number.

Figure 11:
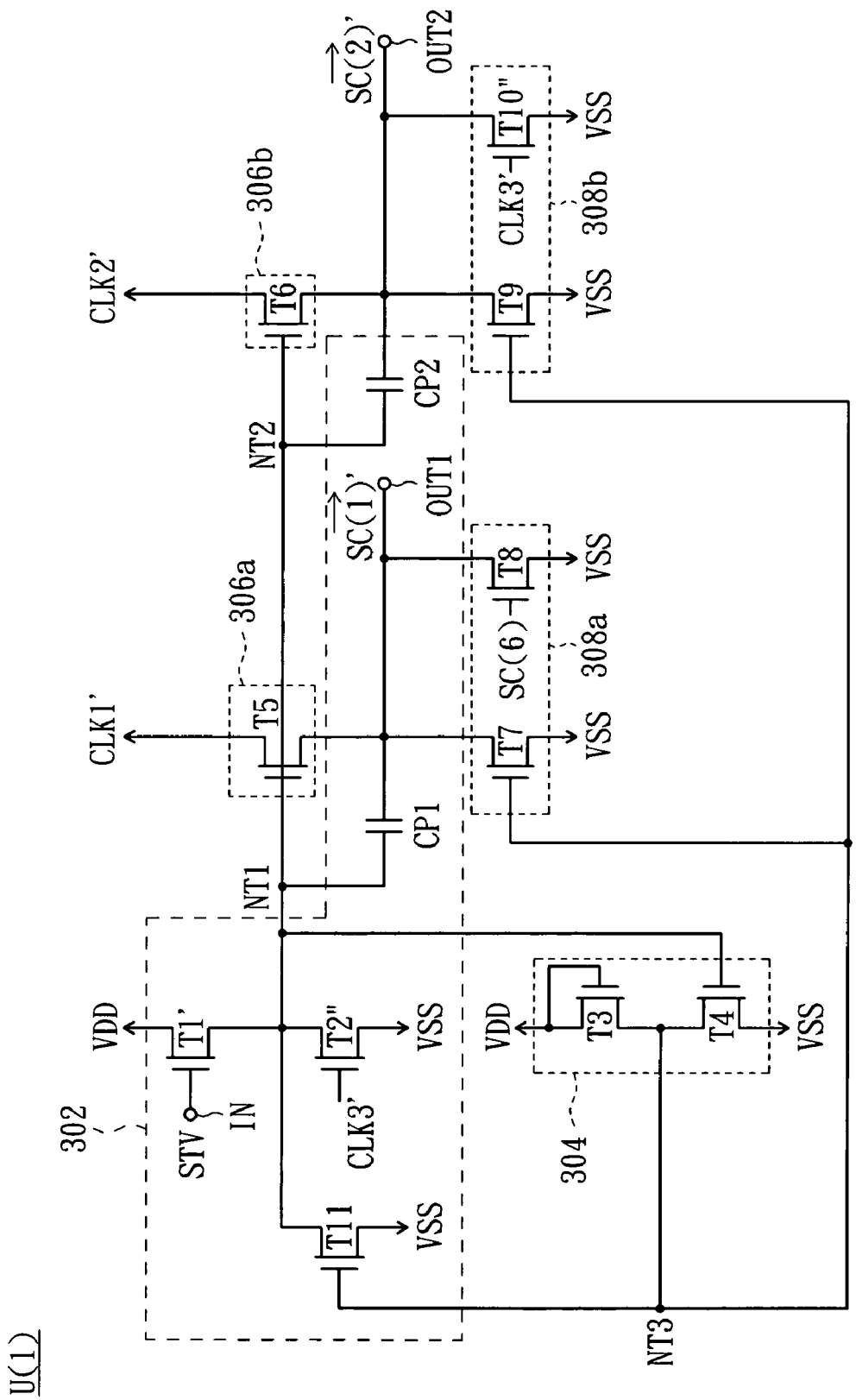
FIG. 11 is a detailed circuit diagram of the shift register unit U(1) in FIG. 10.

The shift register units U(1)~U(x) of FIG. 10 differ from the corresponding odd-stage shift register units W(1), W(3), W(5), . . . , W(k−1) of FIG. 7 by receiving the timing signal CLK3' at the control terminals RT. From FIG. 8, it can be seen that in the time periods TP1'~TP4', the timing signal CLK3' has substantially the same waveform as the scan signal SC(3). Therefore, the shift register unit U(1) has substantially the same operation for providing the scan signals SC(1)' and SC(2)' as the corresponding shift register unit W(1) in FIG. 7. The detailed circuit of the shift register unit U(1) is shown in FIG. 11, wherein the gates of the transistors T2" and T10" receive the timing signal CLK3'.

The other shift register units U(2)~U(x) of the embodiment also have substantially the same operations as the corresponding shift register units W(3), W(5), W(7), ..., W(k−1) in FIG. 7, for respectively generating the corresponding scan signals SC(5)' and SC(6)', SC(7)' and SC(8)', ..., SC(n−3)' and SC(n−2)'.

The shift register 244a also has the similar operation to the shift register 242a. The difference between the shift registers 244a and 242a lies on that in the timing terminals C1 and C2 and the control terminals of the shift register units of the shift register 244a respectively receive the timing signals CLK3', CLK4 and CLK1' for generating the scan signals SC(3)' and SC(4)', SC(7)' and SC(8)', ..., SC(n−1)' and SC(n)'.

Although the first scan driver 242 is exemplified to provide the scan signals SC(4x+1)' and SC(4x+2)' in response to the timing signals CLK1', CLK2' and CLK3', and the second scan driver 244 is exemplified to provide the scan signals SC(4x+3)' and SC(4x+4)' in response to the timing signals CLK3', CLK4 and CLK1' for illustration in the embodiment, the scan driver 24 of the embodiment is not limited to having the above first and second scan drivers 242 and 244, but can further include any other type of scan driver for providing substantially the same scan signals SC(1)'~SC(n)', x=0, 1, 2, ..., Y, Y is a natural number and 4Y+4=n.

Figure 12:
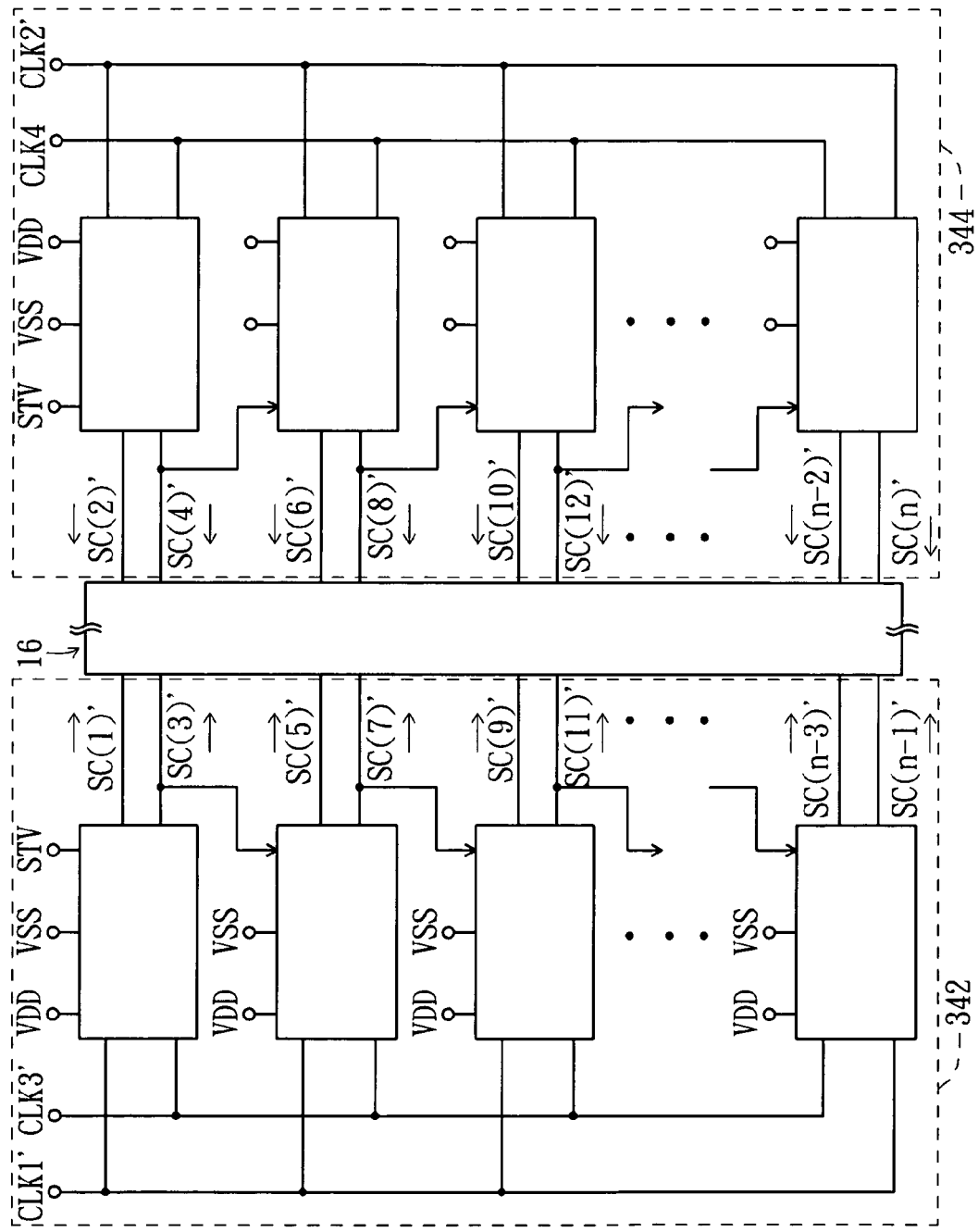
FIG. 12 is a block diagram of the first shift register and the second shift register.

For example, the scan driver 24 includes a first scan driver 342 and a second scan driver 344. The shift register units of the first scan driver 342 provide scan signals SC(1)', SC(3)', SC(5)', ..., SC(n−1)' in response to the timing signals CLK1' and CLK3'. The shift register units of the second scan driver 344 provide scan signals SC(2)', SC(4)', SC(6)', ..., SC(n)' in response to the timing signals CLK2' and CLK4 as shown in FIG. 12.

From the above description, the shift register of the embodiment also has the advantages of using fewer shift register units and having more simplified circuit structure, lower power consumption, slighter signal distortion and longer lifetime.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register, applied to a scan driver of a liquid crystal display (LCD) for generating a plurality of scan signals, the shift register comprising a plurality of stages of shift register units, each of the shift register units comprising:
    a first level lifting unit and at least a second level lifting unit, for respectively providing a first timing signal to a first output terminal and at least a second timing signal to at least a second output terminal;
    a first level lowering unit and at least a second level lowering unit, for respectively providing a first voltage to the first output terminal and at least a second output terminal;
    a first driving unit, coupled to input terminals of the first level lifting unit and the second level lifting unit at a first node, wherein a voltage of the first node is a first control signal, and the first driving unit is for turning on the first level lifting unit and the second level lifting unit in response to a front edge of an input signal and turning off the first level lifting unit and the second level lifting unit as a level of a second control signal is higher than a level of a third control signal; and
    a second driving unit, coupled to input terminals of the first level lowering unit and the second level lowering unit at a second node, wherein the second driving unit is for turning off the first level lowering unit and the second level lowering unit in response to a front edge of the first control signal and turning on the first level lowering unit and the second level lowering unit in response to a rear edge of the first control signal;
    wherein the first output terminal and the second output terminal are for respectively outputting a first scan signal and a second scan signal;
    wherein the input signal is the second scan signal of the previous-stage shift register unit.

2. The shift register according to claim 1, wherein the second level lowering unit comprises a first transistor, and the first transistor has a gate coupled to the second node, a first source/drain coupled to the second output terminal and a second source/drain for receiving the first voltage.

3. The shift register according to claim 2, wherein the second level lowering unit of the n-th stage of shift register unit further comprises a second transistor, and the second transistor has a gate for receiving the first scan signal of the (n+1)-th stage of shift register unit, a first source/drain coupled to the second output terminal and a second source/drain for receiving the first voltage, wherein n is a natural number.

4. The shift register according to claim 2, wherein the second level lowering unit of the n-th stage of shift register unit further comprises a third transistor, and the third transistor has a gate for receiving the first control signal of the (n+1)-th stage of shift register unit, a first source/drain coupled to the second output terminal and a second source/drain for receiving the second timing signal.

5. The shift register according to claim 2, wherein the second level lowering unit of the n-th stage of shift register unit further comprises a fourth transistor, and the fourth transistor has a gate for receiving the first timing control signal of the (n+1)-th stage of shift register unit, a first source/drain coupled to the second output terminal and a second source/drain for receiving the first voltage.

6. The shift register according to claim 1, wherein the first driving unit comprises a fifth transistor, and the fifth transistor has a gate for receiving at least a second scan signal of the previous-stage shift register unit, a first source/drain for receiving a second voltage and a second source/drain coupled to the first node.

7. The shift register according to claim 6, wherein the first driving unit of the n-th stage of shift register unit further comprises a sixth transistor, and the sixth transistor has a gate for receiving the second control signal, a first source/drain coupled to the first node and a second source/drain for receiving the third control signal, wherein n is a natural number.

8. The shift register according to claim 7, wherein the second control signal and the third control signal are respectively equal to the first scan signal of the (n+1)th-stage of shift register unit and the first voltage.

9. The shift register according to claim 7, wherein the second control signal and the third control signal are respectively equal to the first control signal of the (n+1)-th stage of shift register unit and the second timing signal.

10. The shift register according to claim 7, wherein the second control signal and the third control signal are respectively equal to the first timing signal of the (n+1)-th stage of shift register unit and the first voltage.

11. The shift register according to claim 1, wherein the first level lifting unit and the second level lifting unit respectively comprise a seventh transistor and an eighth transistor, and the seventh transistor and the eighth transistor have gates coupled to the first node, first sources/drains respectively for receiving the first timing signal and the second timing signal, and second sources/drains respectively coupled to the first output terminal and the second output terminal.

12. The shift register according to claim 1, wherein the first level lowering unit comprises a ninth transistor, and the ninth transistor has a gate coupled to the second node, a first source/drain coupled to the first output terminal and a second source/drain for receiving the first voltage.

13. The shift register according to claim 12, wherein the first level lowering unit further comprises a tenth transistor, and the tenth transistor has a gate for receiving the second scan signal, a first source/drain coupled to the first output terminal and a second source/drain for receiving the first voltage.

14. The shift register according to claim 1, wherein the second driving unit comprises a bias unit, for controlling a voltage level of the second node in response to the first control signal;
wherein the bias unit is for turning off the first level lowering unit and the second level lowering unit in response to the front edge of the first control signal and turning on the first level lowering unit and the second level lowering unit in response to a rear edge of the first control signal.

15. The shift register according to claim 1, wherein the scan driver provides three period signals whose enabling times are not overlapped to be the first timing signal and the second timing signal of the shift register units, wherein the n-th stage of shift register unit, the (n+1)-th stage of shift register unit and the (n+2)-th stage of shift register unit respectively use a first period signal and a second period signal, a second period signal and a third period signal, and a third period signal and a first period signal of the three period signals to be the first timing signal and the second timing signal.

16. The shift register according to claim 1, wherein the scan driver provides four period signals whose enabling times are not overlapped to be the first timing signal and the second timing signal of each of the shift register units, wherein the n-th stage of shift register unit uses a first period signal and a second period signal of the four period signals as the first timing signal and the second timing signal, and the (n+1)-th stage of shift register unit uses a third period signal and a fourth period signal of the four period signals as the first timing signal and the second timing signal.

17. The shift register according to claim 16, used for generating scan signals for scanning the 1n-th row of pixels and the 2n-th row of pixels in the LCD in response to the first period signal and the second period signal of the four period signals;
wherein the scan driver further comprises another shift register having a similar structure to the shift register, for generating scan signals for scanning the 3n-th row of pixels and the 4n-th row of pixels in the LCD in response to the third period signal and the fourth period signal.

18. A liquid crystal display (LCD), comprising:
a display panel, having a pixel matrix;
a data driver, for providing a plurality of data signals; and
a scan driver, comprising a first shift register for providing a plurality of scan signals for enabling pixels of the pixel matrix to display a data frame according to the data signals, wherein the first shift register comprises a plurality of stages of shift register units and each of the shift register units comprises:
a first level lifting unit and at least a second level lifting unit, for respectively providing a first timing signal to a first output terminal and at least a second timing signal to at least a second output terminal;
a first level lowering unit and at least a second level lowering unit, for respectively providing a first voltage to the first output terminal and at least a second output terminal;
a first driving unit, coupled to input terminals of the first level lifting unit and the second level lifting unit at a first node, wherein a voltage of the first node is a first control signal, and the first driving unit is for turning on the first level lifting unit and the second level lifting unit in response to a front edge of an input signal and turning off the first level lifting unit and the second level lifting unit as a level of a second control signal is higher than a level of a third control signal; and
a second driving unit, coupled to input terminals of the first level lowering unit and the second level lowering unit at a second node, wherein the second driving unit is for turning off the first level lowering unit and the second level lowering unit in response to a front edge of the first control signal and turning on the first level lowering unit and the second level lowering unit in response to a rear edge of the first control signal;
wherein the first output terminal and the second output terminal are for respectively outputting a first scan signal and at least a second scan signal;
wherein the input signal is the second scan signal of the previous-stage shift register unit.

19. The LCD according to claim 18, wherein the second level lowering unit comprises a first transistor, and the first transistor has a gate coupled to the second node, a first source/drain coupled to the second output terminal and a second source/drain for receiving the first voltage.

20. The LCD according to claim 19, wherein the second level lowering unit of the n-th stage of shift register unit further comprises a second transistor, and the second transistor has a gate for receiving the first scan signal of the (n+1)-th stage of shift register unit, a first source/drain coupled to the second output terminal and a second source/drain for receiving the first voltage, wherein n is a natural number.

21. The LCD according to claim 19, wherein the second level lowering unit of the n-th stage of shift register unit further comprises a third transistor, and the third transistor has a gate for receiving the first control signal of the (n+1)-th stage of shift register unit, a first source/drain coupled to the second output terminal and a second source/drain for receiving the second timing signal.

22. The LCD according to claim 19, wherein the second level lowering unit of the n-th stage of shift register unit further comprises a fourth transistor, and the fourth transistor has a gate for receiving the first timing control signal of the (n+1)-th stage of shift register unit, a first source/drain coupled to the second output terminal and a second source/drain for receiving the first voltage.

23. The LCD according to claim 19, wherein the first driving unit comprises a fifth transistor, and the fifth transistor has a gate for receiving at least a second scan signal of the previous-stage shift register unit, a first source/drain for receiving a second voltage and a second source/drain coupled to the first node.

24. The LCD according to claim 23, wherein the first driving unit of the n-th stage of shift register unit further comprises a sixth transistor, and the sixth transistor has a gate for receiving the second control signal, a first source/drain coupled to the first node and a second source/drain for receiving the third control signal, wherein n is a natural number.

25. The LCD according to claim 24, wherein the second control signal and the third control signal are respectively equal to the first scan signal of the (n+1)th-stage of shift register unit and the first voltage.

26. The LCD according to claim 24, wherein the second control signal and the third control signal are respectively equal to the first control signal and the second timing signal of the (n+1)-th stage of shift register unit.

27. The LCD according to claim 24, wherein the second control signal and the third control signal are respectively equal to the first timing signal of the (n+1)-th stage of shift register unit and the first voltage.

28. The LCD according to claim 18, wherein the first level lifting unit and the second level lifting unit respectively comprise a seventh transistor and an eighth transistor, and the seventh transistor and the eighth transistor have gates coupled to the first node, first sources/drains respectively for receiving the first timing signal and the second timing signal, and second sources/drains respectively coupled to the first output terminal and the second output terminal.

29. The LCD according to claim 18, wherein the first level lowering unit comprises a ninth transistor, and the ninth transistor has a gate coupled to the second node, a first source/drain coupled to the first output terminal and a second source/drain for receiving the first voltage.

30. The LCD according to claim 29, wherein the first level lowering unit further comprises a tenth transistor and the tenth transistor has a gate for receiving the second scan signal, a first source/drain coupled to the first output terminal and a second source/drain for receiving the first voltage.

31. The LCD according to claim 18, wherein the second driving unit comprises a bias unit, for controlling a voltage level of the second node in response to the front edge of the first control signal;
wherein the bias unit is for turning off the first level lowering unit and the second level lowering unit in response to the front edge of the first control signal and turning on the first level lowering unit and the second level lowering unit in response to a rear edge of the first control signal.

32. The LCD according to claim 18, wherein the scan driver provides three period signals whose enabling times are not overlapped to be the first timing signal and the second timing signal of the first shift register, wherein the n-th stage of shift register unit, the (n+1)-th stage of shift register and the (n+2)-th stage of the first shift register respectively use a first period signal and a second period signal, a second period signal and a third period signal, and a third period signal and a first period signal of the three period signals to be the first timing signal and the second timing signal.

33. The LCD according to claim 18, wherein the scan driver provides four period signals whose enabling times are not overlapped to be the first timing signal and the second timing signal of each of the shift register units, wherein the n-th stage of shift register unit uses a first period signal and a second period signal of the four period signals as the first timing signal and the second timing signal, and the (n+1)-th stage of shift register unit uses a third period signal and a fourth period signal of the four period signals as the first timing signal and the second timing signal.

34. The LCD according to claim 33, wherein the first shift register is used for generating scan signals for scanning the 1n-th row of pixels and the 2n-th row of pixels in the LCD in response to the first period signal and the second period signal of the four period signals;
wherein the scan driver further comprises a second shift register having a similar structure to the first shift register, for generating scan signals for scanning the 3n-th row of pixels and the 4n-th row of pixels in the LCD in response to the third period signal and the fourth period signal.

35. The LCD according to claim 34, wherein the scan driver is a double-sided scan driver located near two opposite sides of the pixel matrix.

* * * * *